United States Patent
Tsubotani

(10) Patent No.: US 10,847,908 B2
(45) Date of Patent: Nov. 24, 2020

(54) CONNECTED BOARD AND DISPLAY DEVICE

(71) Applicant: SHARP KABUSHIKI KAISHA, Sakai (JP)

(72) Inventor: Masashi Tsubotani, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 18 days.

(21) Appl. No.: 16/449,151

(22) Filed: Jun. 21, 2019

(65) Prior Publication Data

US 2020/0036119 A1   Jan. 30, 2020

Related U.S. Application Data

(60) Provisional application No. 62/703,178, filed on Jul. 25, 2018.

(51) Int. Cl.

| H05K 1/02 | (2006.01) |
| H05K 1/14 | (2006.01) |
| H05K 1/18 | (2006.01) |
| G02F 1/1333 | (2006.01) |
| G06F 3/041 | (2006.01) |
| G06F 3/044 | (2006.01) |
| G06F 3/045 | (2006.01) |
| H01R 12/62 | (2011.01) |
| H05K 1/11 | (2006.01) |

(52) U.S. Cl.
CPC ............ *H01R 12/62* (2013.01); *H05K 1/0277* (2013.01); *H05K 1/115* (2013.01); *H05K 1/14* (2013.01); *G02F 1/13338* (2013.01); *H05K 2201/10136* (2013.01)

(58) Field of Classification Search
CPC .. H05K 1/02; H05K 1/14; H05K 1/18; H05K 1/115; G02F 1/1333; G06F 3/041; G06F 3/044; G06F 3/045
USPC ........ 361/749; 345/102, 156, 173, 174, 177; 349/12, 58, 60, 61
See application file for complete search history.

(56) References Cited

U.S. PATENT DOCUMENTS 8,643,803 B2 * 2/2014 Miyazaki ............ G02F 1/13318
                                                            345/102
9,615,477 B2 * 4/2017 Ling ...................... H05K 7/026
(Continued)

FOREIGN PATENT DOCUMENTS

| JP | 2010-186804 A | 8/2010 |
| JP | 2016-129170 A | 7/2016 |

*Primary Examiner* — Xiaoliang Chen
(74) *Attorney, Agent, or Firm* — ScienBiziP, P.C.

(57) ABSTRACT

A connected board includes a first circuit board including a first ground and a second circuit board including a second ground. The first circuit board includes a rigid portion and a flexible portion. The rigid portion includes a section of a conductive layer having flexibility and hard substrates prepared from an insulator and having rigidity. The section of the conductive layer is bonded to the hard substrates and held by the hard substrates. The flexible portion includes a section of the conductive layer extending from the rigid portion and a soft substrate covering the section. The soft substrate includes a connection hole for connecting the second circuit board to the first circuit board. The second circuit board is mounted to the flexible portion in the connection hole. The second ground is directly connected to the conductive layer of the first circuit board.

5 Claims, 7 Drawing Sheets

(56) References Cited

U.S. PATENT DOCUMENTS

| | | | |
|---|---|---|---|
| 9,798,414 B2* | 10/2017 | Kim | G06F 3/0416 |
| 9,986,643 B2* | 5/2018 | Gute | H05K 1/028 |
| 10,129,623 B2* | 11/2018 | Koppal | H04R 1/06 |
| 10,352,799 B2* | 7/2019 | Li | G06F 3/045 |
| 10,459,554 B2* | 10/2019 | Funayama | G02F 1/133385 |
| 2014/0362326 A1* | 12/2014 | Terazawa | G02F 1/13452 |
| | | | 349/58 |

* cited by examiner

CONNECTED BOARD AND DISPLAY DEVICE

CROSS REFERENCE TO RELATED APPLICATION

This application claims priority from U.S. Provisional Patent Application No. 62/703,178 filed on Jul. 25, 2018. The entire contents of the priority application are incorporated herein by reference.

TECHNICAL FIELD

The technology described herein relates to a connected board and a display device.

BACKGROUND ART

In recent years, display devices including display panels with sensors for touch panels, digitizers, Wi-Fi, and LTE have been widely used. The sensors are sensitive to noises resulting in malfunctions. Improvement in grounding is needed. In each display device, grounding can be improved through commonization of a ground of a control circuit board for the sensors and a ground of a control circuit board for the display device.

In general, circuit boards are grounded using a conductive adhesive component such as a conductive tape and a conductive. The grounding has been improved by improving performance of the conductive adhesive component or increasing an attachment area. The conductive adhesive component has a recognizable electrical resistance that may vary according to conditions of attachment (e.g., an attachment area and a condition of contact). A surface of a metal bezel or a chassis to which the conductive adhesive component is attached for grounding is plated and thus has high resistance. Namely, the improvement in grounding using the conductive adhesive component has limitations. A grounding structure using the conductive adhesive component is hard to exert an effect on improvement of grounding as required performance increases. Japanese Unexamined Patent Application Publication No. 2010-186804 discloses a method of increasing a grounding function (grounding characteristics) by adding a silver film to a surface layer of a flexible circuit board to provide a ground (GND) contact area.

A rigid-flexible circuit board including a flexible portion having flexibility and a rigid portion having rigidity has been used for mounting electronic components. Japanese Unexamined Patent Application Publication No. 2016-129170 discloses a rigid-flexible circuit board including a rigid circuit board layer that is a core layer and multiple flexible circuit board layers sandwiching the core layer from the front and the rear. In the rigid-flexible circuit board, the rigid-flexible circuit board layer that is a core and the flexible circuit board layers on the rear in a mounting area for mounting IC components include holes. Solder joint areas on a printed circuit board can easily follow expansion and contract of packages due to variations in temperature. Reliability of the solder joints in the packages including components mounted in surface layers of substrates improves.

The ground region (the GND region) of the flexible circuit board is connected to the silver film via a ground connecting portion formed in a section of a coverlay. The silver film is connected to a ground region of a main circuit board or a common ground portion of an electronic device on which the flexible circuit board is mounted in a ground contact area. The ground portion of the flexible circuit board is connected to a grounding component via the ground connecting portion and the silver film. Namely, the configuration is complicated. Due to electric resistances of the relevant components and joint areas, the improvement in grounding has limitations.

In the rigid-flexible circuit board, the core layer (the rigid circuit board layer) and a rear layer (the flexible circuit board layer) have the holes in the component mounting areas. Therefore, the grounding performance of the circuit board may decrease. With the flexible circuit board having the multilayer configuration, a decrease in grounding performance is less likely to occur; however, the number of layers of the circuit board increases and the configuration of the circuit board becomes complicated.

SUMMARY

The technology described herein was made in view of the above circumstances. An object is to commonize and enhance grounds between circuit boards with a simple configuration without using a conductive adhesive component.

A connected board includes a first circuit board and a second circuit board. The first circuit board includes a first ground. The second circuit board includes a second ground. The first circuit board and the second circuit board are connected to each other. The first circuit board includes a rigid portion and a flexible portion. The rigid portion includes a section of a conductive layer prepared from a conductor and having flexibility and hard substrates prepared from an insulator and having rigidity. The section of the conductive layer is bonded to the hard substrates and held by the hard substrates. The flexible portion includes a section of the conductive layer extending from the rigid portion and a soft substrate covering the section of the conductive layer. The first ground is prepared from the conductive layer. The soft substrate includes a connection hole for connecting the second circuit board to the first circuit board. The second circuit board is mounted to the flexible portion of the first circuit board in the connection hole of the soft substrate. The second ground is directly connected to the conductive layer of the first circuit board.

According to the configuration, the first ground and the second ground are directly connected to each other without a conductive adhesive component such as a conductive tape and a conductive cloth. An electrical resistance may increase when the conductive adhesive component is used or the number of connections is increased resulting in complication of the structure. According to the configuration described above, such an increase is less likely to occur. At the same time, variations in electrical resistance due to variations in performance of interposed components such as a conductive adhesive component or conditions of connection of the interposed components. The grounds are stably commonized with the simple configuration and the grounds can be enhanced. The circuit boards do not required for areas to which the conductive adhesive component is bonded. Therefore, the dimensions of the circuit board can be reduced or component mountable areas for mounting electronic components can be increased. The configuration described above can be provided only by directly mounting the second circuit board on the conductive layer of the first circuit board having the rigid-flexible structure. Namely, a special mounting tool is not required. The connection hole may be formed toward an edge of the flexible portion.

According to the technology described herein, a display device including enhanced grounds of circuit boards and having fewer malfunctions is provided.

DETAILED DESCRIPTION

First Embodiment

Figure 1:
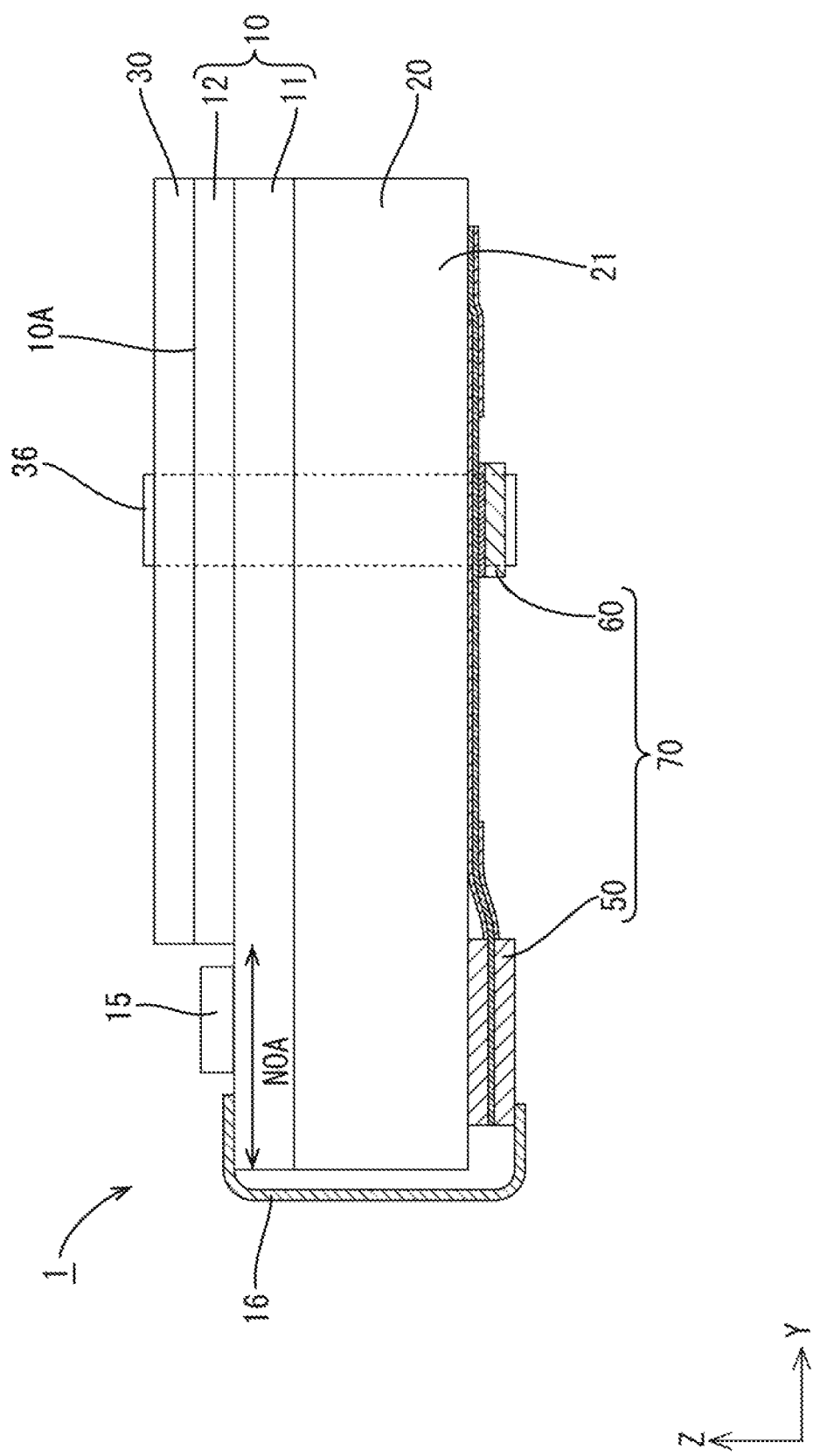
FIG. 1 is a schematic view schematically illustrating a cross-sectional configuration of a liquid crystal display device according to a first embodiment.

A first embodiment will be described with reference to FIGS. 1 to 3. In the first embodiment section, a liquid crystal display device 1 (an example of a display device) including a connected board will be described. X-axes, Y-axes, and Z-axes may be present in the drawings. The axes in each drawing correspond to the respective axes in other drawings. An upper side in FIG. 1 corresponds to a front side (a lower side corresponds to a back side). One of components having the same configuration may be marked with a reference number and the other of the components may not be marked with the reference number (this rule may be applied to a modification of the first embodiment and a second embodiment).

As illustrated in FIG. 1, the liquid crystal display device 1 according to this embodiment includes a liquid crystal panel 10 (an example of a display panel), a touch panel 30, and a backlight unit 20 (an example of a lighting unit). The liquid crystal display device 1 according to this embodiment has a rectangular shallow box overall shape (see the rear view in FIG. 2). The following description refers to the liquid crystal display device 1 placed with a long side of the rectangular shape, a short side of the rectangular shape, and a depth (in the front-rear direction) along the X-axis direction, the Y-axis direction, and the Z-axis direction, respectively. The liquid crystal display device 1 according to the first embodiment may be applied to electronic devices including notebook personal computers (including tablet-type personal computers), mobile phones (including smartphones), wearable terminals (including smartwatches), portable information terminals (including digital book players and PDAs), onboard information terminals (including car navigation systems), and portable video players. The liquid crystal panel 10 has a screen size in a range from some inches to dozen inches categorized into a small or a small-to-medium size in general. The technology described herein is especially suitable for relatively small liquid crystal display devices including sensors for touch panels and cameras. However, the application of the technology described herein is not limited to such liquid crystal display devices and can be applied to displays having screen sizes of several tens of inches or larger categorized into a medium or a large (or an extra-large) size.

An outline of the configuration of the liquid crystal panel 10 illustrated in FIG. 1 will be described. The liquid crystal panel 10 is for displaying images on a display screen 10A on the front side. The liquid crystal panel 10 may have any known configuration. The liquid crystal panel 10 includes two substrates 11 and 12 and a liquid crystal layer. The substrates 11 and 12 are separated by a predefined gap and bonded together. The liquid crystal layer is sealed between the substrates 11 and 12. One of the substrates 11 and 12 disposed on the rear side is a pixel electrode substrate 11 (an array substrate, a TFT substrate) including a transparent substrate. Switching components (e.g., TFTs), pixel electrodes, a common electrode, and an alignment film are disposed on an inner surface of the transparent substrate (on a liquid crystal layer side, a surface opposed to a common substrate, which will be described later). The switching components are connected to source lines and gate lines that are perpendicular to each other. The pixel electrodes and the common electrode are connected to the switching components. The substrate disposed on the front side is the common substrate 12 (a CF substrate) including a transparent substrate. Color filters including red (R), green (G), and blue (B) color portions arranged in a predefined pattern, a light blocking film, and an alignment film are disposed on an inner surface of the transparent substrate. The light blocking film is for blocking transmission of light.

An outline of the configuration of the touch panel 30 illustrated in FIG. 1 will be described. The touch panel 30 may have a known configuration including touch sensors for detecting touch positions on the display screen 10A. In this first embodiment section, the touch panel 30 that is an out-cell type and bonded to the front surface of the liquid crystal panel 10 to overlay the display screen 10A will be described. A cover panel is bonded to the front surface of the touch panel 30. The touch panel 30 will not be illustrated in detail. The touch panel 30 may include multiple lines of first light transmissive electrodes and second light transmissive electrodes extending in the X-axis direction and the Y-axis direction, respectively, on an outer surface of the transparent substrate (on the front side, on an opposite side from, the liquid crystal panel). The first light transmissive electrodes and the second light transmissive electrodes are made of substantially transparent light transmissive and electrically conductive material. The first light transmissive electrodes and the second light transmissive electrodes are the touch sensors for detecting touch positions. An insulating film is disposed between the first light transmissive electrodes and the second light transmissive electrodes. The first light transmissive electrodes, the insulating film, and the second transparent electrodes are disposed in this sequence on the transparent substrate and form a single-sided laminated structure. Furthermore, potential supply lines are disposed on the transparent substrate for supplying potentials to the light transmissive electrodes.

An outline of the configuration of the backlight unit 20 illustrated in FIG. 1 will be described. The backlight unit 20 may have any known configuration. The backlight unit 20 may include a light source including light emitting diodes (LEDs) to apply light to the liquid crystal panel 10 from the back side. The backlight unit 20 may be, but not limited to, a direct backlight or an edge-light backlight (a side-light backlight). If the backlight unit 20 is the direct backlight, the light source is disposed immediately behind the liquid crystal panel 10 in the inner side of the backlight unit 20. If the backlight unit 20 is the edge-light backlight, the a light guide plate is disposed to overly the liquid crystal panel 10 in the inner side of the backlight unit 20 and light sources are disposed along an edge of the light guide plate.

Figure 2:
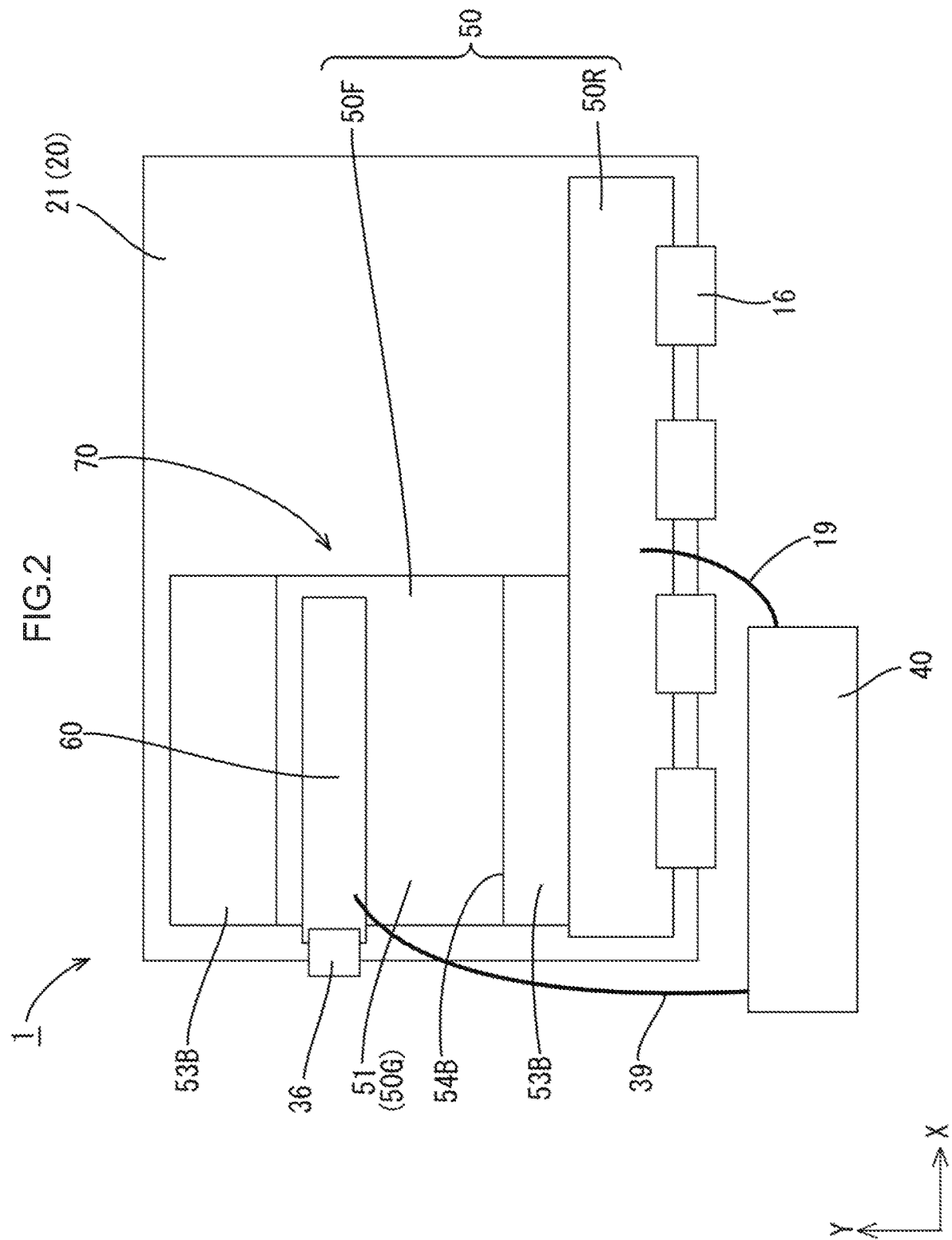
FIG. 2 is a schematic view schematically illustrating a two-dimensional configuration of a back side of the liquid crystal display device.
Figure 3:
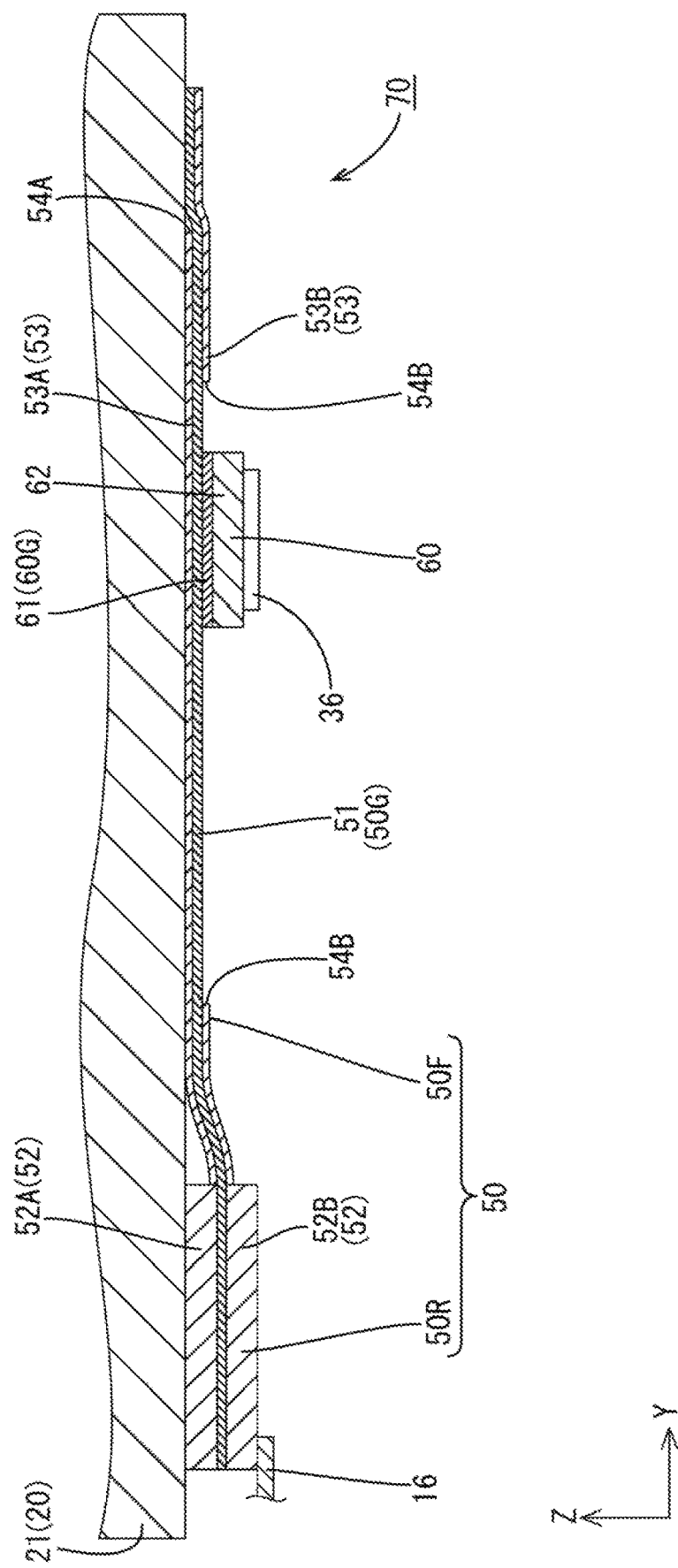
FIG. 3 is a schematic view schematically illustrating a cross-sectional configuration of a connected board connected to a chassis.

As illustrated in FIGS. 1 and 2, the backlight unit 20 includes a chassis 21 having an opening on the front side, that is, a light exiting side (on a liquid crystal panel 10 side) and a predefined thickness. The chassis 21 has a function of housing components of the backlight unit 20 including the light sources and various optical components therein and holding the components. In the first embodiment section, the chassis 21 having the opening on the front side and a rectangular shallow box shape will be described. The chassis 21 in the first embodiment is made of metal having electrical conductivity such as stainless steel and aluminum.

Next, operation of the liquid crystal panel 10 and a configuration for controlling of the operation will be described. In the liquid crystal panel 10 having the configuration described above, when predefined potential differences are created between the pixel electrodes and the common electrode and the switching components are driven, a horizontal electric field parallel to the plate surfaces of the substrates 11 and 12 or a fringe electric field (an oblique electric field) is applied to the liquid crystal layer sealed between the substrates 11 and 12. By controlling the electric field, orientation of the liquid crystal molecules in the liquid crystal layer can be controlled where appropriate.

The polarizing plates are bonded to outer surfaces of the substrates 11 and 12, respectively. The polarizing plates pass light beams that vibrate in a specific direction. The light beams that have passed through the polarizing plate on the rear side and entered the liquid crystal layer travel through the liquid crystal layer in the rear-front direction (the Z-axis direction) while changing polarizing conditions according to the orientation of the liquid crystal molecules. Some of the light beams that can pass the polarizing plate on the front side exit are provided as display light. As described earlier, by controlling the electric field applied to the liquid crystal layer to change the orientation of the liquid crystal molecules, a rate of transmission of light that passes through the liquid crystal panel 10 varies and an image is displayed on the front surface (an image display surface) of the liquid crystal panel 10.

As illustrated in FIG. 1, in the liquid crystal panel 10, the pixel electrode substrate 11 has a short dimension measuring in the Y-axis direction larger than that of the common substrate 12. The pixel electrode substrate 11 is overlaid on the common substrate 12 with a first long edge aligned with a first long edge of the common substrate 12. The pixel electrode substrate 11 includes a substrate non-overlapping area NOA at an end closer to a second long edge. The common substrate 12 does not overlap the substrate non-overlapping area NOA. A driver 15 (a driver component) is mounted in the substrate non-overlapping area NOA. The driver 15 is configured to control potentials of the pixel electrodes described earlier for driving the switching components in the pixel electrode substrate 11. A fist end of a panel flexible substrate 16 (a transmission component) is connected to the substrate non-overlapping area NOA. The panel flexible substrate 16 is for transmitting signals to the driver 15. As illustrated in FIG. 1, the panel flexible substrate 16 connected to the front surface of the pixel electrode substrate 11 is folded along long side surfaces of the liquid crystal panel 10 and the backlight unit 20. A second end of the panel flexible substrate 16 is connected to a panel control circuit board 50 on a back surface side of the chassis 21. The panel control circuit board 50 is a control circuit board for controlling supply of signals for displaying images on the liquid crystal panel 10. The panel control circuit board 50 is fixed to the back surface of the chassis 21. As illustrated in FIG. 2, the panel control circuit board 50 is connected to a main circuit board 40 via a cable 19.

Next, operation of touch sensors in the touch panel 30 and a configuration for controlling the operation will be described. In the touch panel 30 having the configuration described earlier, voltages are applied to multiple lines of the first transparent electrodes and multiple lines of the second transparent electrodes in sequence. When a finger of the user, which is a conductive body, touches or approaches the display screen 10A, capacitive coupling occurs between one of the transparent electrodes and the finger of the user. A capacitance at the transparent electrode is different from a capacitance at any other transparent electrodes. A plane of coordinates is defined on the display screen 10A. A sensor-control circuit board 60, which will be described later, detects the transparent electrode at which the capacitance is different. Then, coordinates on the display screen 10A corresponding to an intersection of the transparent electrode are converted into a two-dimensional (the X-axis and the Y-axis) position information signal regarding a position of touch by the user on the display screen 10A to detect the position of touch (a projected capacitive type).

As illustrated in FIGS. 1 and 2, a first end of a touch sensor flexible substrate 36 is connected to an end of the touch panel 30 closer to one of short edges of the touch panel 30. The touch sensor flexible substrate 36 is for supplying potentials to the first transparent electrodes and the second transparent electrodes and transmitting positions signals detected by the touch sensors. The touch sensor flexible substrate 36 connected to the touch panel 30 is folded along short side surfaces of the liquid crystal panel 10 and the backlight unit 20 (side surfaces on farther side in FIG. 1). A second end of the touch sensor flexible substrate 36 is connected to the sensor control circuit board 60 on the back surface of the chassis 21. The sensor control circuit board 60 has functions for supplying potentials to the transparent electrodes and detecting positions of touch on the touch panel 30. As illustrated in FIG. 2, the sensor control circuit board 60 is connected to the main circuit board 40 via a cable 39.

Ground lines and ground planes are included in the liquid crystal panel 10 and the touch panel 30, driving of which is controlled by electric signals, to reduce effect of noise that may be caused by static. The grounds are connected to a panel-side ground 50G in the panel control circuit board 50 or a sensor-side ground 60G in the sensor control circuit board 60 via the panel flexible substrate 16 of the touch sensor flexible substrate 36. According to the technology described herein, the panel control circuit board 50 and the sensor control circuit board 60 are connected to each other to form a connected board 70. In the first embodiment, the connected board 70 is bonded to the back surface of the chassis 21 of the backlight unit 20.

A configuration and connection of the panel control circuit board 50 included in the connected board 70 will be described with reference to FIGS. 2 and 3. As illustrated in FIG. 3, the panel control circuit board 50 according to the technology described herein includes a rigid portion 50R having rigidity and a flexible portion 50F having flexibility, that is, the panel control circuit board 50 has a rigid-flexible structure. In the first embodiment, the panel control circuit board 50 is fixed to the back surface of the chassis 21 of the backlight unit 20.

As illustrated in FIG. 2, the rigid portion 50R of the panel control circuit board 50 is formed in a longitudinal rectangular shape along a long edge of the chassis 21 on the back surface of the chassis 21. Various electronic components are mounted on the rigid portion 50R. As illustrated in FIG. 3, the rigid portion 50R includes at least a conductive plane 51 (an example of a conductive layer) having flexibility and a hard substrate 52 having rigidity. The conductive plane 51 includes a conductor formed in a solid pattern. The hard substrate 52 includes an insulator made of a phenol resin, an epoxy resin, or a glass composite material. For the conductive layer, a wiring layer in which a conductive pattern is formed may be provided instead of the conductive plane 51. However, in the first embodiment section, the conductive plane 51 that is prepared from a copper foil and formed in a solid pattern of copper will be described. The conductive plane 51 is electrically connected to a ground in the liquid crystal panel 10 via the panel flexible substrate 16. The conductive plane 51 functions as the panel-side ground 50G. The panel control circuit board 50 in the first embodiment includes two hard substrates 52A and 52B against plate surfaces of the conductive plane 51 to sandwich the conductive plane 51 and electric lines for establishing electrical connection among the electronic components. The electric lines are conductors formed through patterning and connected via through holes. In the first embodiment, an outer surface of the first hard substrate 52A (an opposite surface from the conductive plane 51) is fixed to the back surface of the chassis 21. The panel control circuit board 50 is fixed to the back surface of the backlight unit 20 with the plate surfaces of the conductive plane 51 and the hard substrates 52A and 52B about parallel to the back surface of the chassis 21. The second hard substrate 52B is disposed on the back surface of the conductive plane 51. Terminals are formed on the outer surface of the hard substrate 52B and the end of the panel flexible substrate 16 is connected to the terminals.

As illustrated in FIG. 2, the flexible portion 50F of the panel control circuit board 50 extends from at least a section of the rigid portion 50R toward the second long edge of the chassis 21 on the back surface side of the chassis 21. As illustrated in FIG. 3, the flexible portion 50F includes soft substrates 53 disposed on the plate surfaces of the conductive plane 51. The soft substrates 53 are insulators prepared from a polyimide film or polyester film and having flexibility. In the first embodiment, the soft substrate 53A is disposed on the front side of the conductive plane 51 (on the backlight unit 20 side) to extend from the end surface of the hard substrate 52A to a section closer to end of the flexible portion 50F for an entire area to cover the front plate surface of the conductive plane 51. The soft substrate 53A is fixed to the back surface of the chassis 21 to hold the conductive plane 51. In the first embodiment, the soft substrate 53A includes a ground hole 54A in an distal end portion of the flexible portion 50F to a distal edge. A section of the conductive plane 51 exposed through the ground hole 54A is fixed to the chassis 21 to directly contact the chassis 21 (that is, the ground hole 54A in the first embodiment is formed toward the distal edge of the flexible portion 50F). As illustrated in FIG. 2, the soft substrate 53B disposed on the back surface side of the conductive plane 51 includes a connection hole 54B in the middle of the flexible portion 50F. The sensor control circuit board 60 is directly mounted on a section of the conductive plane 51 exposed through the connection hole 54B. At the ends of the flexible portion 50F with respect to the Y-axis direction, the conductive plane 51 is sandwiched between the soft substrate 53A and the soft substrate 53B that is disposed in a deformed section of the flexible portion 50F extending from the rigid portion 50R. The conductive plane 51 is held by the soft substrates 53A and 53B and thus less likely to be broken. The soft substrate 53B holds the section of the conductive plane 51 in the ground hole 54A from the back side instead of the soft substrate 53A.

Next, a configuration and connection of the sensor control circuit board 60 included in the connected board 70 will be described with reference to at least FIGS. 2 and 3. A general printed circuit board (a rigid circuit board) having a known configuration may be used for the sensor control circuit board 60. The sensor control circuit board 60 in the first embodiment includes at least a conductive layer 61 prepared from a conductor and an insulating substrate 62 prepared from am insulator. Various electronic components may be mounted on the sensor control circuit board 60, the electric lines connecting the electronic components may be formed on the sensor control circuit board 60, and through holes for establishing electrical connection between layers may be formed in the sensor control circuit board 60. The conductive layer 61 is electrically connected to the ground in the touch panel 30 via the touch sensor flexible substrate 36. The conductive layer 61 functions as the sensor-side ground 60G. The conductive layer 61 may be an electrical line layer prepared from a conductor through patterning. In the first embodiment section, the conductive layer 61 that is a conductive plate prepared by forming the conductor in a solid pattern will be described. The insulating substrate 62 may be a soft substrate having flexibility or a hard substrate having rigidity. In this embodiment section, the insulating substrate 62 made of a material from which the hard substrate of the rigid portion 50R of the panel control circuit board 50 is made and having rigidity will be described. As illustrated in at least FIG. 3, in the first embodiment, at least a section of the conductive layer 61 is exposed so that the conductive layer 61 directly contacts the conductive plane 51 of the flexible portion 50F of the panel control circuit board 50.

(1) As described above, the connected board 70 according to the first embodiment includes the panel control circuit board 50 (a first circuit board) and the sensor control circuit board 60 (a second circuit board) connected to each other. The panel control circuit board 50 includes the panel-side ground 50G (a first ground). The sensor control circuit board 60 includes the sensor-side ground 60G (a second ground). The panel control circuit board 50 includes the rigid portion 50R and the flexible portion 50F. In the rigid portion 50R, the section of the conductive plane 51 (a conductive layer) prepared from the conductor and having flexibility is sandwiched between the hard substrates 52 prepared from the insulator and having rigidity. In the flexible portion 50F, the section of the conductive plane 51 extending from the rigid portion 50R is covered with the soft substrates 53 prepared from the insulator and having flexibility. The panel-side ground 50G (the first ground) is prepared from the conductive plane 51. The soft substrate 53B includes the connection hole 54B for connecting the sensor control circuit board 60. The sensor control circuit board 60 is mounted on the flexible portion 50F of the panel control circuit board 50 in the connection hole 54B of the soft substrate 53B. The sensor-side ground 60G is directly connected to the conductive plane 51 of the panel control circuit board 50.

According to the configuration of the first embodiment, the panel-side ground 50G prepared from the conductive plane 51 and the sensor-side ground 60G prepared from the conductive layer 61 are directly connected to each other without any other component such as a conductive adhesive component and commonized. In comparison to a configuration that uses the conductive adhesive component, the number of connections is smaller and thus the configuration is less likely to be complicated. Therefore, electrical resistances are less likely to increase. Furthermore, effects of performance of an interposed component such as the conductive adhesive component and variation in electrical resistance due to connecting conditions of the interposed component can be reduced. The panel-side ground 50G in the first embodiment is prepared from the conductive plane 51 that is a conductor formed in the solid pattern. In comparison to a configuration that uses a general conductive adhesive component including a conductive material contained in an adhesive, a significantly higher level of conductivity can be achieved. With a simple configuration, stable commonization of the grounds is provided, that is, the grounds are enhanced.

In the control circuit boards 50 and 60, areas to which conductive adhesive components adhere are not required. Therefore, dimensions of the circuit boards can be reduced and an electronic component mountable area can be increased. Especially in the first embodiment, the conductive layer of the panel control circuit board 50 having the rigid-flexible structure is the conductive plane 51 including only the conductor formed in the solid pattern. Therefore, by directly placing the sensor control circuit board 60 and mounted on the conductive plane 51, the grounds 50G and 60G of the control circuit boards 50 and 60 are electrically connected. Without a special mounting tool, the grounds can be commonized. In the first embodiment, the connection hole 54B is formed to have an opening area larger than the mounting area of the sensor control circuit board 60. The section of the conductive plane 51 exposed through the connection hole 54B functions as the panel-side ground 50G. Because the section of the conductive plane 51 is less likely to be affected by corrosion, such a large hole can be formed in the soft substrate 53B. With a metal component for grounding disposed close to the section or ground connection via a conductive adhesive component adhering to the section, the grounds can be further enhanced. The ground hole 54A. in the soft substrate 53A can be formed larger. To enhance the grounds, contact areas with the chassis 21 that functions as a grounding component can be increased.

(2) In the connected board 70 according to the first embodiment, in addition to the above (1), the panel control circuit board 50 is for displaying images on the liquid crystal panel 10 (a display panel) configured to display images. The electronic components are mounted on the rigid portion 50R. The sensor control circuit board 60 is a sensor control circuit board for controlling the touch sensors (sensors) of the touch panel 30 included in the liquid crystal panel 10.

According to the configuration of the first embodiment, the grounds are commonized without giving up on a reduction in thickness or frame width of the display panel for the sensors in the display panel for which the enhancement of the grounds is in high demand.

(3) In the connected board 70 according to the first embodiment, in addition to the above (1) or (2), the soft substrate 53A includes the ground hole 54A. for grounding and the conductive plane 51 is directly connected to the chassis 21 (the grounding component) having electrical conductivity through the ground hole 54A.

According to the configuration of the first embodiment, not only the grounds of the panel control circuit board 50 and the sensor control circuit board 60 are commonized but also the grounds are enhanced by directly connecting the chassis 21 that is a metal component to the conductive plane 51.

(4) In the connected board 70 according to the first embodiment, in addition to the above (3), the chassis 21 is a holding component made of metal for holding the liquid crystal panel 10 (the display panel) configured to display images or the backlight unit 20 (a lighting unit) attached to the liquid crystal panel 10 for applying light.

According to the configuration of the first embodiment, grounding can be possible using a metal bezel of the liquid crystal panel 10 or the chassis 21 of the backlight unit 20, similar to the known configuration. Therefore, the commonization or enhancement of the grounds can be achieved without significant design alteration.

(5) The liquid crystal display device 1 (the display device) according to the first embodiment includes the connected board 70 described in any one of the above (1) through (4).

According to the configuration of the first embodiment, the liquid crystal display device 1 that is less likely to have malfunctions can be provided.

Modification of the First Embodiment

A modification of the first embodiment will be described with reference to FIGS. 4 and 5. A liquid crystal display device 101 according to the modification includes a connected board 170 disposed with positional relationships with the liquid crystal panel 10 and the backlight unit 20 different from those of the connected board 70 in the first embodiment. In the following description about the modification, components having the same configurations as those of the components in the first embodiment will be indicated by the same reference symbols and will not be described (this rule is applied to a description of a second embodiment).

Figure 4:
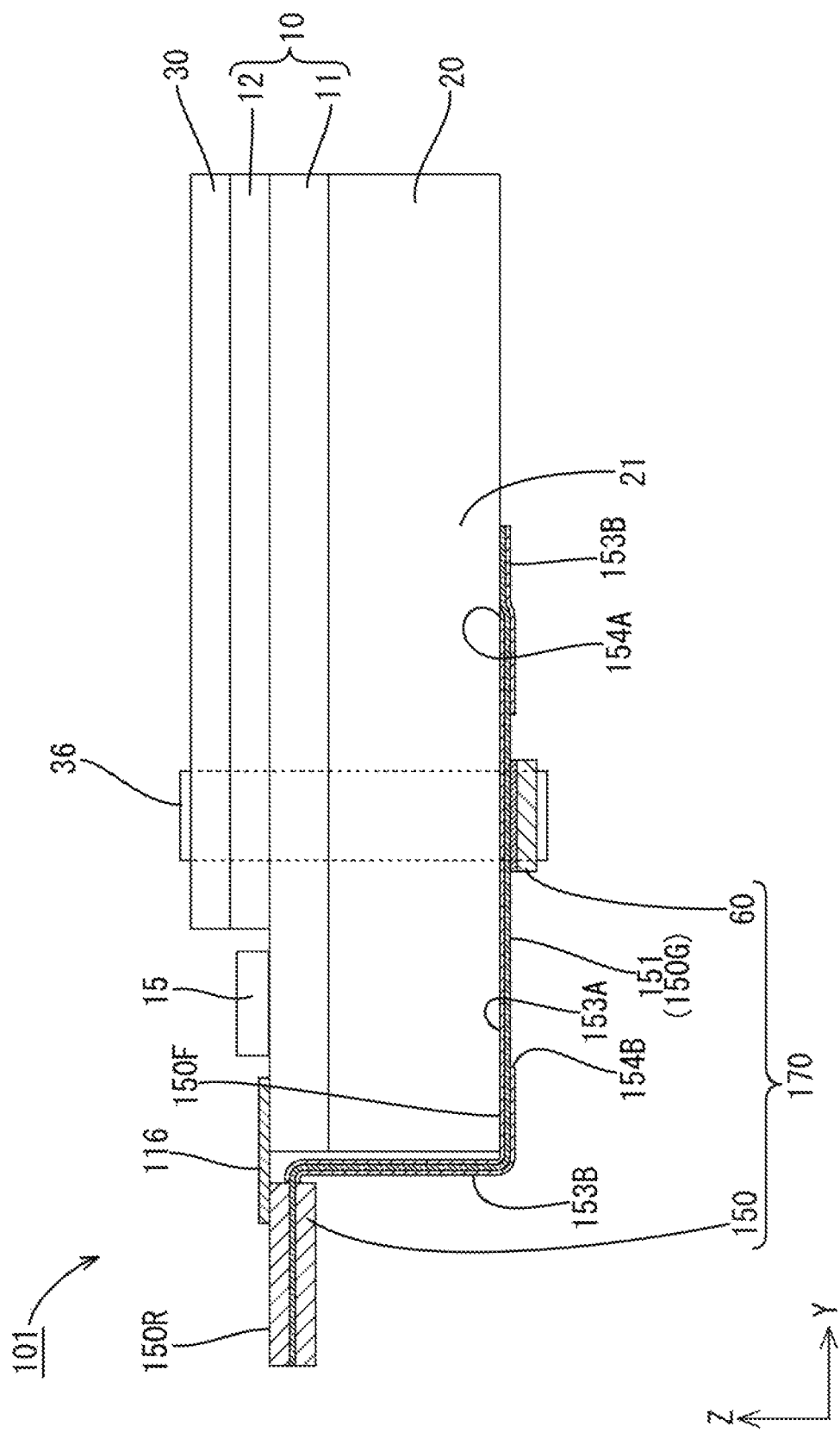
FIG. 4 is a schematic view schematically illustrating a cross-sectional configuration of a liquid crystal display device according to a modification of the first embodiment.
Figure 5:
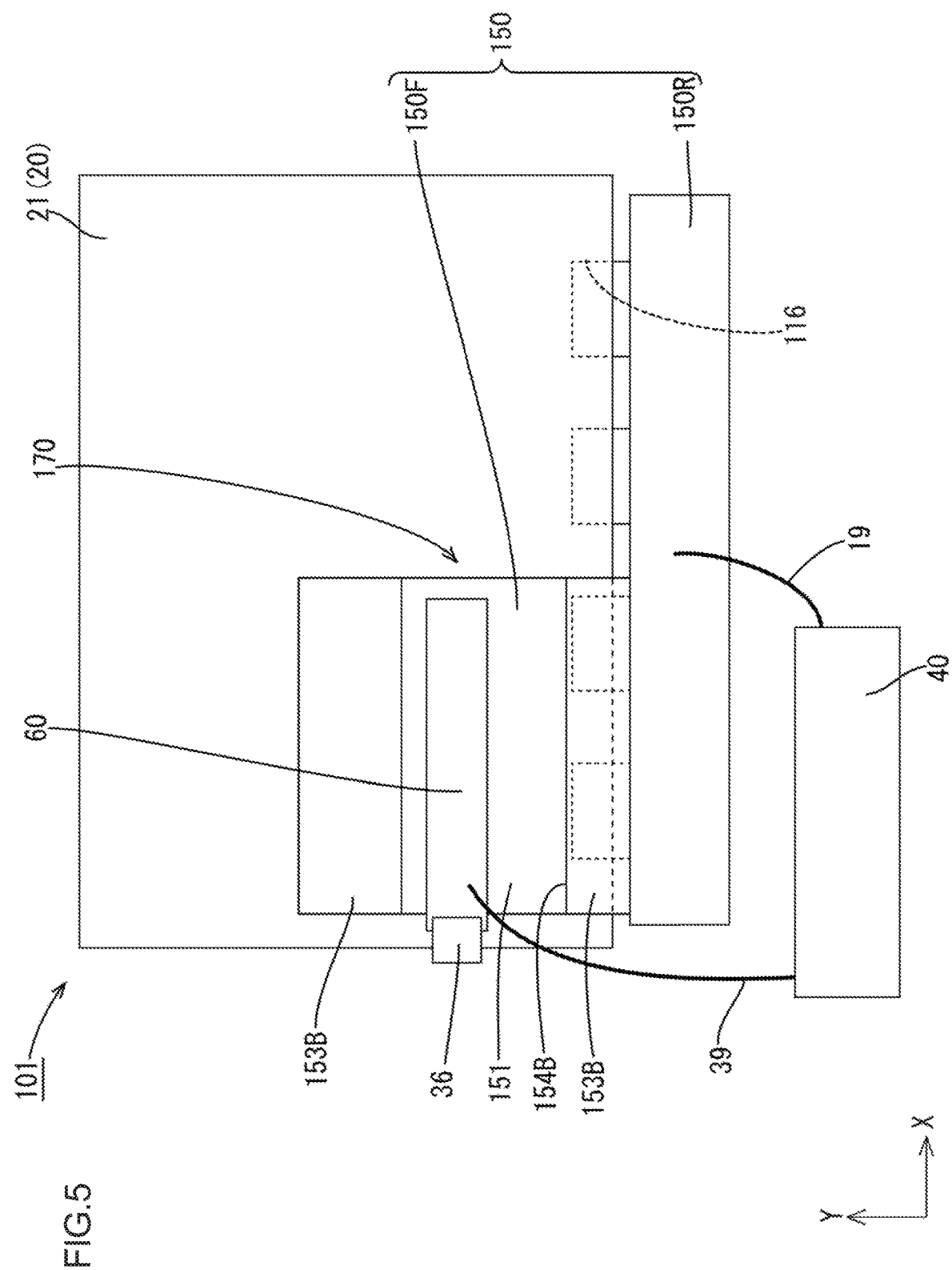
FIG. 5 is a schematic view schematically illustrating two-dimensional configuration of a back side of the liquid crystal display device.

As illustrated in FIG. 4, in this modification, a front surface of a rigid portion 150R of a panel control circuit board 150 included in the connected board 170 and a front surface of the pixel electrode substrate 11 of the liquid crystal panel 10 are disposed on the same plane. A panel flexible substrate 116 is shorter in the Y-axis direction than the panel flexible substrate 16 in the first embodiment. A flexible portion 150F of the panel control circuit board 150 is bent along long side surfaces of the liquid crystal panel 10 and the backlight unit 20 and fixed to the back surface of the chassis 21. A soft substrate 153A and a soft substrate 153B are disposed on a front surface and a back surface of a conductive plane 151 that forms a panel-side ground 150G, respectively, at a bent section of the flexible portion 150F. The soft substrates 153A and 153B hold the conductive plane 151 from both sides. As illustrated in FIG. 5, the soft substrate 153B on the back surface includes a large connection hole 154B in the middle of a section fixed to the back surface of the chassis 21. The sensor control circuit board 60 is mounted in the connection hole 154B. The conductive layer 61 that form the sensor-side ground 60G is directly connected to an exposed section the conductive plane 151.

In the modification, the rigid portion 150R of the panel control circuit board 150 does not overlap the liquid crystal panel 10 and the backlight unit 20. Therefore, the liquid crystal display device 101 including a portion having a thickness smaller than the liquid crystal display device 1 according to the first embodiment is provided.

Second Embodiment

A second embodiment will be described with reference FIGS. 6 and 7. The second embodiment includes a liquid crystal display device 201 that is disposed with positional relationships with the liquid crystal panel 10 and the backlight unit 20 different from, those of the connected board 70 in the first embodiment. Furthermore, the connected board 270 includes a panel control circuit board 250 and the sensor control circuit board 60 that are connected differently from, those of the first embodiment.

The liquid crystal display device 201 according to the second embodiment may be a personal computer including a camera. The connected board 270 includes a sensor control circuit board 260 for controlling driving of sensors for receiving images from the camera and a panel control circuit board 250 for controlling driving of the liquid crystal panel 10. The sensor control circuit board 260 and the panel control circuit board 250 are connected to each other. The sensor control circuit board 260 for the camera may be disposed on an opposite side from the main circuit board 40 relative to the liquid crystal panel 10 depending on a location of the camera in the liquid crystal display device 201. In such a configuration, the sensor control circuit board 260 is far from the main circuit board 40, that is, a distance between the sensor control circuit board 260 and the main circuit board 40 is large. A cable 239 connecting the sensor control circuit board 260 to the main circuit board 40 needs to be extended in accordance with the distance. If a thickness of the cable 239 is small, it may be difficult to stabilize a ground for the sensors of the camera as the distance of the cable 239 increases. Inducement of malfunctions of the sensor control circuit board 260 may increase.

Figure 6:
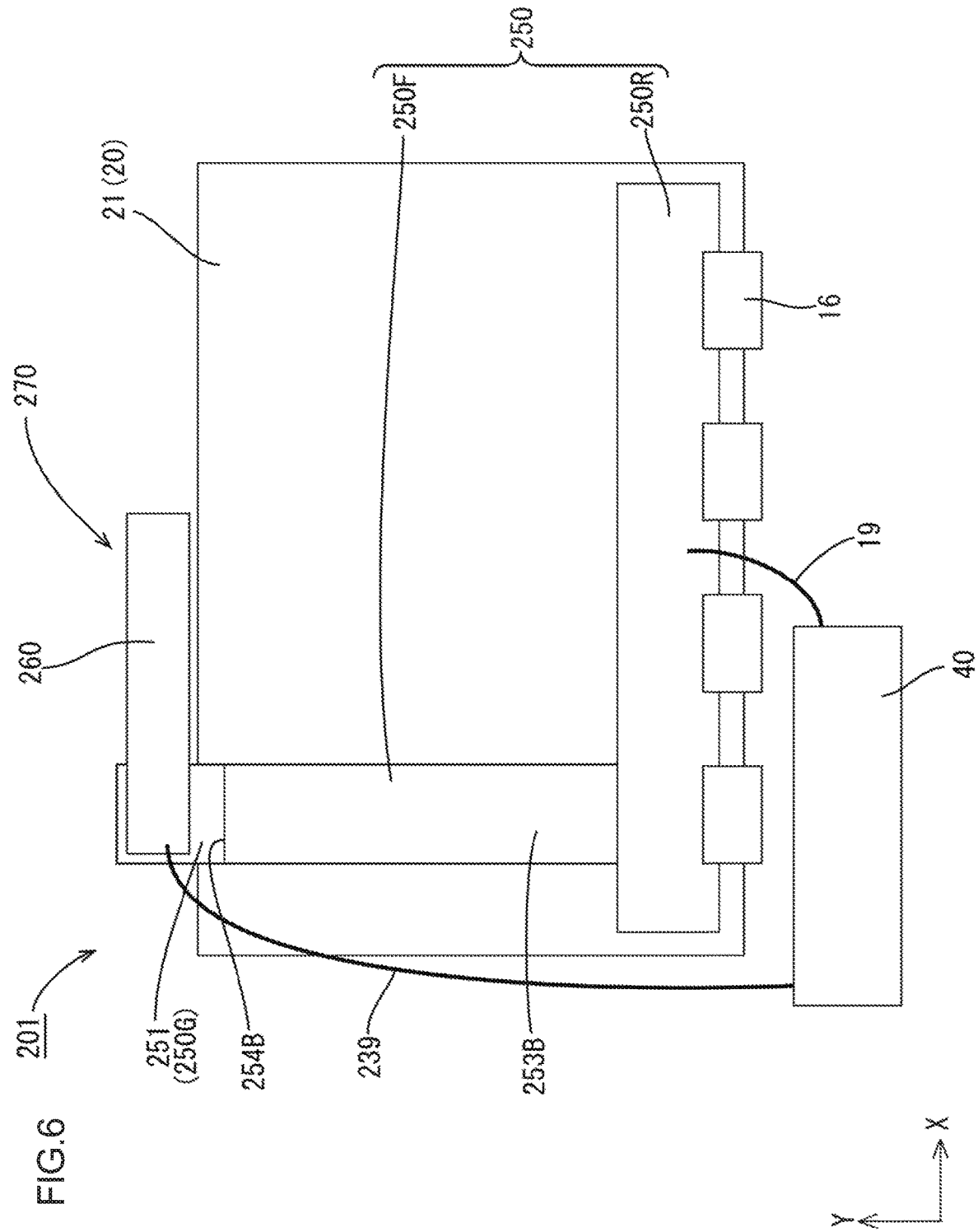
FIG. 6 is a schematic view schematically illustrating two-dimensional configuration of a back side of a liquid crystal display device according to a second embodiment.

As illustrated in FIG. 6, in the connected board 270 in the second embodiment, the flexible portion 250F of the panel control circuit board 250 extends from the rigid portion 250R to an outer side of the chassis 21 over a long edge of the chassis 21 on am opposite side from a long edge ate which the rigid portion 250R is disposed. The sensor control circuit board 260 is mounted on a distal end section of the flexible portion 250F, which will be described later. Namely, the connected board 270 in the second embodiment is bonded to the back surface of the chassis 21 with the sensor control circuit board 260 and the distal end section including a mounting area in which the sensor control circuit board 260 is mounted projected from, the chassis 21.

Figure 7:
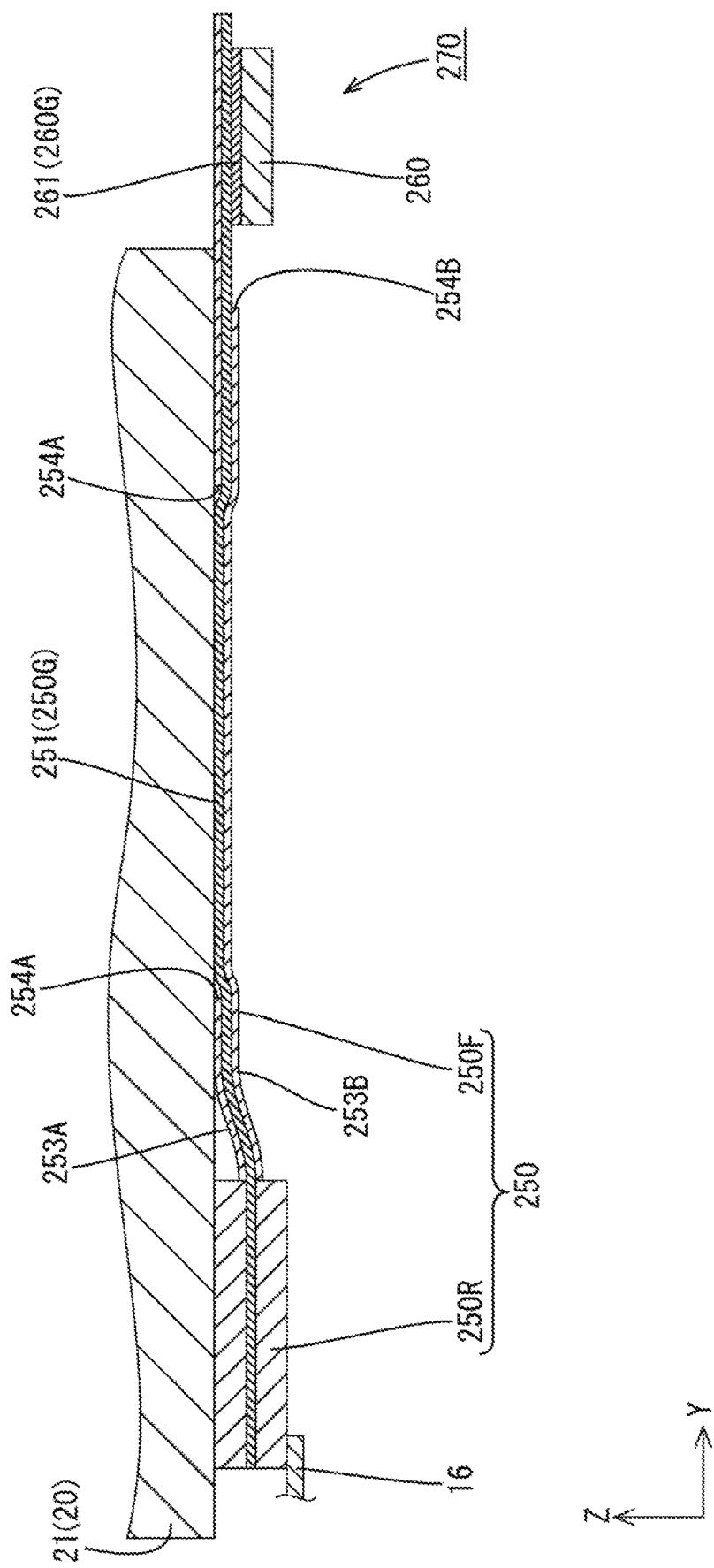
FIG. 7 is a schematic view illustrating a cross-sectional configuration of a connected board connected to a chassis.

As illustrated in FIG. 7, in the flexible portion 250F of the panel control circuit board 250, a soft substrate 253A disposed on a front side of a conductive plane 251 that forms a panel-side ground 250G includes a large ground hole 54A in the middle of the flexible portion 250F that is elongated in the Y-axis direction. A section of the conductive plane 251 exposed through the ground hole 54A is fixed so that a large area thereof directly contacts the chassis 21. A soft substrate 253B disposed on the back surface of the conductive plane 251 includes a connection hole 254B in an end section that does not overlap an opening area of the ground hole 254A. The sensor control circuit board 260 is mounted in the connection hole 254B. According to the configuration, the conductive layer 261, which forms a sensor-side ground 260G, and the conductive plane 251 of the panel control circuit board 250 are directly connected to each other.

In the second embodiment, as described above, the sensor-side ground 260G of the sensor control circuit board 260 is directly connected to the panel-side ground 250G of the panel control circuit board 250. The ground of the sensor-control circuit board 260 disposed away from the main circuit board 40 can be enhanced through the commonization. A. control circuit board for a sensor that may be for a camera, Wi-Fi, or LTE may be subjected to noise if it is difficult to arrange the control circuit board closer to the main circuit board 40. The technology described herein can be effectively applied to such a control circuit board. In the connected board 270 in the second embodiment, the flexible portion 250F of the panel control circuit board 250 includes the large ground hole 254A in a substantially entire area except for the area of the connection hole 254B. The section of the conductive plane 251 is fixed to the chassis 21 so that the section directly contacts the chassis 21. With the large contact area with the grounding component, the ground is further enhanced.

Other Embodiments

The technology described herein is not limited to the embodiments described in the above descriptions and drawings. The following embodiments may be included in the technical scope of the technology described herein.

(1) In each of the above embodiments, the connection hole and the ground hole are formed in the surfaces of the flexible portion of the first circuit board (the panel control circuit board) sandwiching the conductive layer (the conductive plane). However, the technology described herein is not limited to such a configuration. The holes may be formed in the same surface of the conductive layer. Furthermore, in each of the above embodiments, the connection hole and the ground hole are separated from each other. However, the holes may continue to each other. In each of the above embodiments, the connection hole that is relatively large is formed in the flexible portion of the first circuit board. A grounding component having conductivity may be disposed to contact or closer to the connection hole to enhance the ground.

(2) In each of the above embodiments, the holding component (the metal chassis) of the lighting unit is used for the grounding component. However, the grounding component is not limited to the holding component. For example, a ground may be provided using a metal bezel for holding a display panel.

(3) In each of the above embodiments, the control circuit board for the display panel (the panel control circuit board) is defined as the first circuit board. The ground (the conductive plane) of the first circuit board and the ground (the conductive layer) of the control circuit board for controlling the sensors for the touch panel and the camera (the sensor control circuit board) are commonized. However, the technology described herein is not limited to such a configuration. The technology described herein can be applied to any circuit board having grounds. For example, the technology described herein can be applied to a connected board for connecting a light source control circuit board for controlling a light source.

(4) The arrangement of the connected board in the display device and the shape of the display device and/or the shape of the display panel are not limited. If the connected board is disposed at a position not to overlap the display panel or the lighting unit in a plan view, the thickness of the display device can be reduced. The technology described herein can be applied to display devices including display panels in any two-dimensional shapes including a circular shape, an oval shape, and irregular shapes. Display panels that may be bent to be in three-dimensional shapes or curved may be included in the scope of the technology described herein.

(5) In each of the above embodiments, the display device including the display panel and the lighting unit. However, the technology described herein may be applied to a display device that does not include a lighting unit. Furthermore, in each of the above embodiments, the liquid crystal display device to which the technology described herein is applied includes a liquid crystal panel. However, the technology described herein can be applied to other types of display panels (organic EL panels, plasma display panels (PDPs), microcapsule-type electrophoretic display panels (EPDs), micro electro mechanical systems (MEMS) display panels).

The invention claimed is:

1. A connected board comprising:
a first circuit board including a first ground; and
a second circuit board including a second ground, wherein
the first circuit board and the second circuit board are connected to each other,
the first circuit board includes:
a rigid portion including a section of a conductive layer prepared from a conductor and having flexibility and hard substrates prepared from an insulator and having rigidity, the section of the conductive layer being bonded to the hard substrates and held by the hard substrates; and
a flexible portion including a section of the conductive layer extending from the rigid portion and a soft substrate covering the section of the conductive layer,
the first ground is prepared from the conductive layer,
the soft substrate includes a connection hole for connecting the second circuit board to the first circuit board,
the second circuit board is mounted to the flexible portion of the first circuit board in the connection hole of the soft substrate, and
the second ground is directly connected to the conductive layer of the first circuit board.

2. The connected board according to claim 1, wherein
the first circuit board is a panel control circuit board for displaying images on a display panel configured to display the images,
the first circuit board includes an electronic component mounted on the rigid portion, and
the second circuit board is a sensor control circuit board for controlling a sensor included in the display panel.

3. The connected board according to claim 1, wherein
the soft substrate includes a ground hole for grounding, and
the conductive layer is directly connected to a grounding components having conductivity in the ground hole.

4. The connected board according to claim 3, wherein the grounding component is a metal holding component for holding a display panel configured to display images.

5. A display device comprising the connected board, according to claim 1.

* * * * *